US011437539B2

(12) United States Patent
Huang et al.

(10) Patent No.: US 11,437,539 B2
(45) Date of Patent: Sep. 6, 2022

(54) OPTICAL SENSOR PACKAGE AND MANUFACTURING METHOD FOR THE SAME

(71) Applicant: LITE-ON SINGAPORE PTE. LTD., Singapore (SG)

(72) Inventors: Chien-Hsiu Huang, New Taipei (TW); Yu-Chou Lin, New Taipei (TW); Teck-Chai Goh, Singapore (SG)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 51 days.

(21) Appl. No.: 17/037,858

(22) Filed: Sep. 30, 2020

(65) Prior Publication Data

US 2022/0102576 A1 Mar. 31, 2022

(51) Int. Cl.
| | |
|---|---|
| *H01L 31/173* | (2006.01) |
| *H01L 31/18* | (2006.01) |
| *H01L 31/0216* | (2014.01) |
| *H01L 31/0203* | (2014.01) |

(52) U.S. Cl.
CPC ........ *H01L 31/173* (2013.01); *H01L 31/0203* (2013.01); *H01L 31/02164* (2013.01); *H01L 31/18* (2013.01)

(58) Field of Classification Search
CPC ............... H01L 31/173; H01L 31/0203; H01L 31/02164; H01L 31/18
See application file for complete search history.

(56) References Cited

U.S. PATENT DOCUMENTS

| | | | | |
|---|---|---|---|---|
| 2015/0243802 | A1* | 8/2015 | Fujimoto | H01L 31/02164 257/82 |
| 2016/0284920 | A1* | 9/2016 | Saugier | G01S 7/481 |
| 2016/0284921 | A1* | 9/2016 | Fujimoto | H01L 31/02325 |
| 2017/0294426 | A1* | 10/2017 | Uchida | G01S 17/04 |
| 2020/0127156 | A1* | 4/2020 | Camarri | H01L 31/18 |
| 2020/0335471 | A1* | 10/2020 | Umeda | C08G 77/06 |
| 2020/0355885 | A1* | 11/2020 | Tesanovic | H01L 31/0203 |

FOREIGN PATENT DOCUMENTS

CN 102264503 A * 11/2011 ........... G02B 6/4237

* cited by examiner

*Primary Examiner* — Sitaramarao S Yechuri
(74) *Attorney, Agent, or Firm* — Li & Cai Intellectual Property (USA) Office

(57) ABSTRACT

A manufacturing method of an optical sensor package includes: disposing a chip on a circuit board, the chip including a light emitting area and a light receiving area; disposing at least one light emitting element, which is electrically connected to the circuit board, on the light emitting area of the chip; coating a light blocking material between the light emitting area and the light receiving area; filling a light permeable material that covers the circuit board, the chip, the light blocking material, and the at least one light emitting element; removing a part of the light permeable material disposed between the light emitting area and the light receiving area, forming a first recess and expose the light blocking material; and filling an anti-light-leakage material in the first recess, to form a lateral light blocking structure through stacking the anti-light-leakage material and the light blocking material.

20 Claims, 7 Drawing Sheets

OPTICAL SENSOR PACKAGE AND MANUFACTURING METHOD FOR THE SAME

FIELD OF THE DISCLOSURE

The present disclosure relates to an optical sensor package and manufacturing method for the same, and more particularly to an optical sensor package and manufacturing method for the same that can effectively reduce light leakage.

BACKGROUND OF THE DISCLOSURE

With the development of technology, downsizing sensors have always been the trend for wearable devices. Therefore, utilizing packaging technology to manufacture thinner and smaller sensors, while reducing the light leakage problem, has become an important issue for the optical sensor industry.

SUMMARY OF THE DISCLOSURE

In response to the above-referenced technical inadequacies, this present disclosure provides an optical sensor package.

In one aspect, the present disclosure provides an optical sensor package having a lateral light blocking structure including: a chip that is disposed on the circuit board, having a light emitting area and a light receiving area. At least one light emitting element is disposed on the light emitting area of the chip. A light blocking material is disposed between the light emitting area and the light receiving area. A light permeable material is covered on the circuit board, the chip, the at least one light emitting element, and the light blocking material, and the light permeable material has a first recess that exposes a part of the light blocking material. An anti-light-leakage material is disposed in the first recess that is formed by the light permeable material. The light blocking material and the anti-light-leakage material are stacked to form a lateral light blocking structure, and a light emitted by the at least one light emitting element are blocked by the lateral light blocking material from being laterally transmitted to the light receiving area.

One of the advantages of the present disclosure is that the optical sensor package and the manufacturing method for the same are able to reduce the problem of light leakage and prevent the chip from being damaged in the cutting or etching process through disposing the light blocking material under the light permeable material, thereby decreasing the total volume of the optical sensor.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Embodiment of the Manufacturing Method

Figure 1:
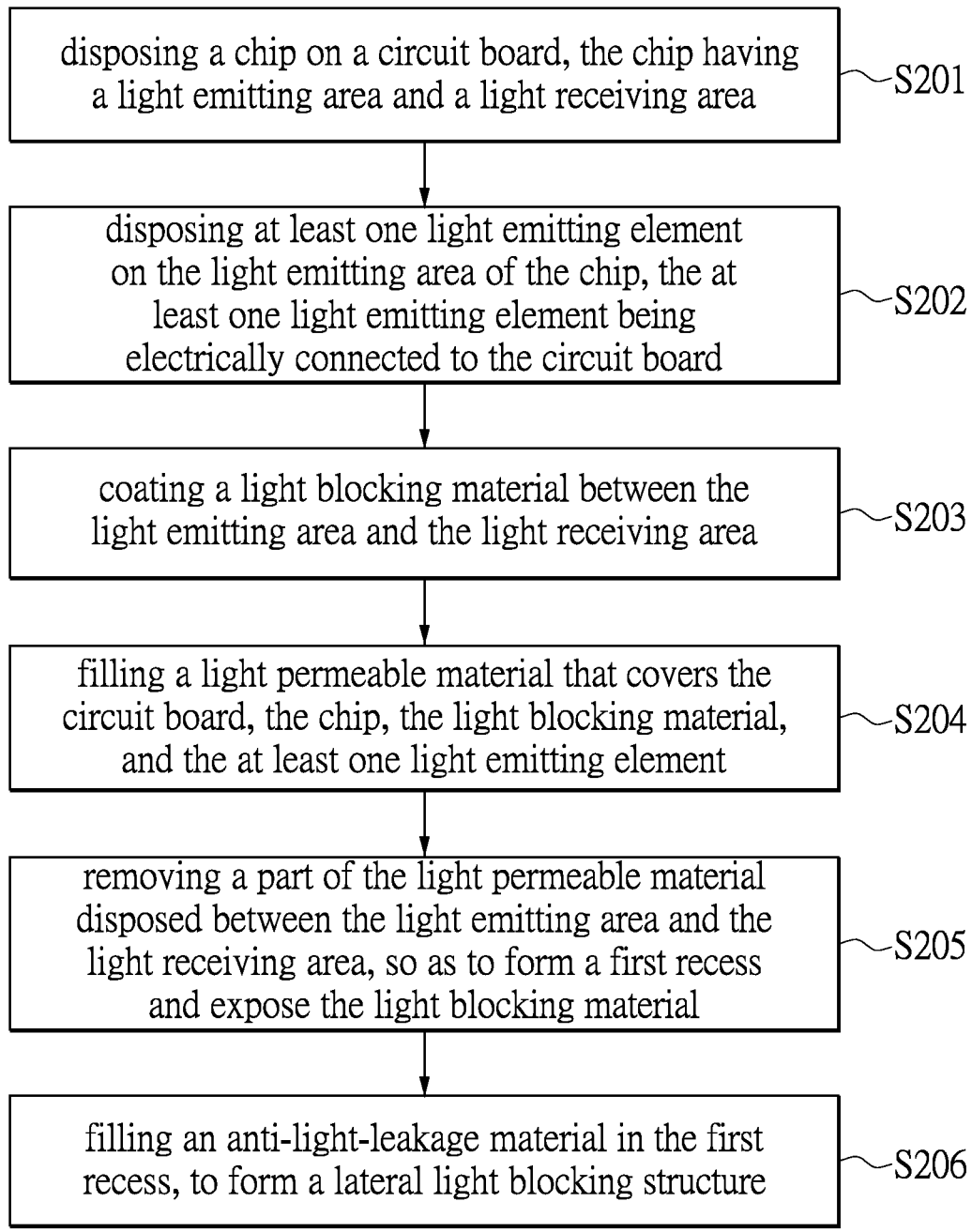
FIG. 1 is a flowchart of a manufacturing method of an optical sensor package of the present disclosure.

FIG. 1 is a flowchart of a manufacturing method of an optical sensor package of the present disclosure.

Reference is made to FIG. 1, and in conjunction with FIG. 2A to FIG. 2F and FIG. 3A to FIG. 3F, a manufacturing method of an optical sensor package of an embodiment of the present disclosure is provided, and the manufacturing method includes the following steps.

Figure 2A:
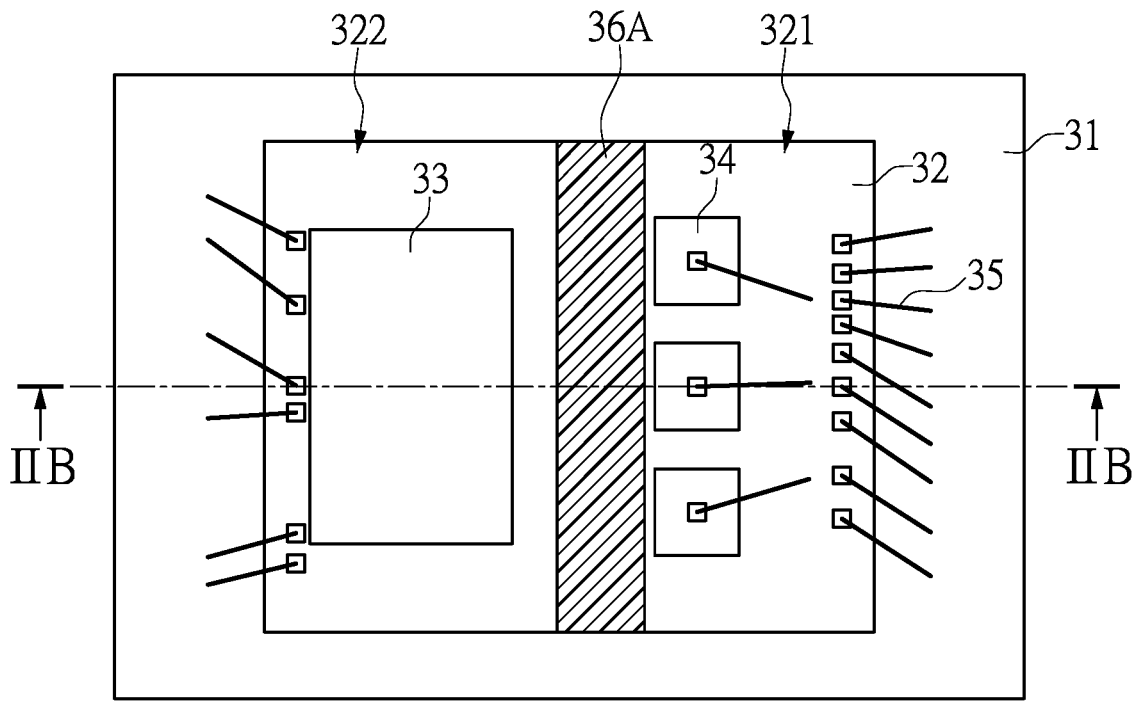
FIG. 2A is a top view of a chip being coated with a light blocking material in an embodiment of the present disclosure.
Figure 2B:
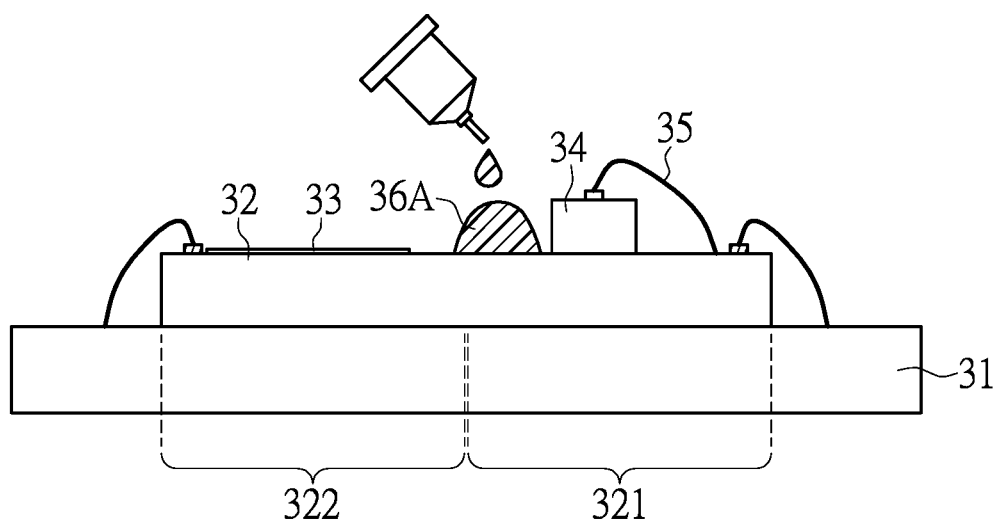
FIG. 2B is a cross-sectional view taken along line IIB-IIB of FIG. 2A.

In step S201, a chip 32 is disposed on a circuit board 31, and the chip 32 has a light emitting area 321 and a light receiving area 322. A light receiver 33 is disposed on the light receiving area 322 of the chip 32. Next, in step S202, at least one light emitting element 34 is disposed on the light emitting area 321 of the chip 32, and the at least one light emitting element 34 is preferably a light emitting diode (LED), and preferably disposed on the circuit board 31 through a die attach method. The chip 32 and the at least one light emitting element 34 are electrically connected to the circuit board 31, as shown in FIG. 2A and FIG. 2B. Moreover, the chip 32 can be connected to the circuit board 31 through wire bonding with a wire 35, and the at least one light emitting element 34 and the chip 32 are connected to each other through the wire 35.

Next, in step S203, a light blocking material 36A is coated between the light emitting area 321 and the light receiving area 322. In a preferable embodiment of the present disclosure, the light blocking material 36A is coated between the light emitting area 321 and the light receiving area 322 (i.e., between the at least one light emitting element 34 and the light receiver 33) of the chip 32 through dispensing, so as to reduce the problem of light leakage.

Figure 3A:
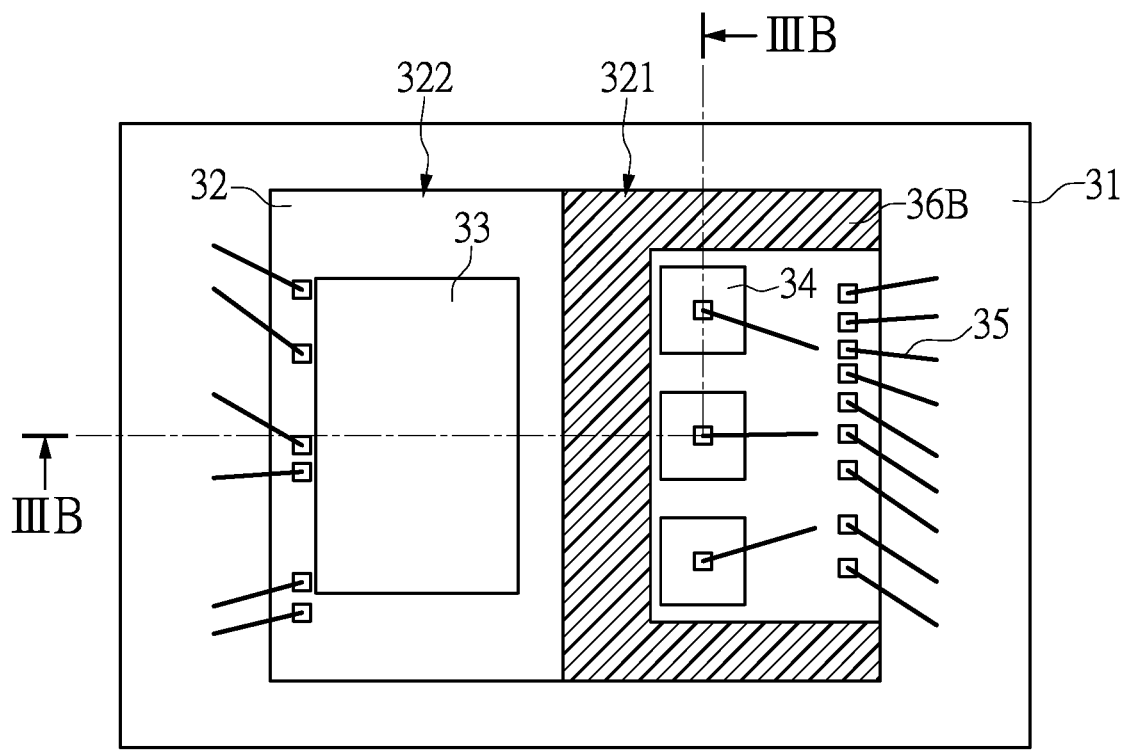
FIG. 3A is a top view of the chip being coated with a light blocking material in another embodiment of the present disclosure.
Figure 3B:
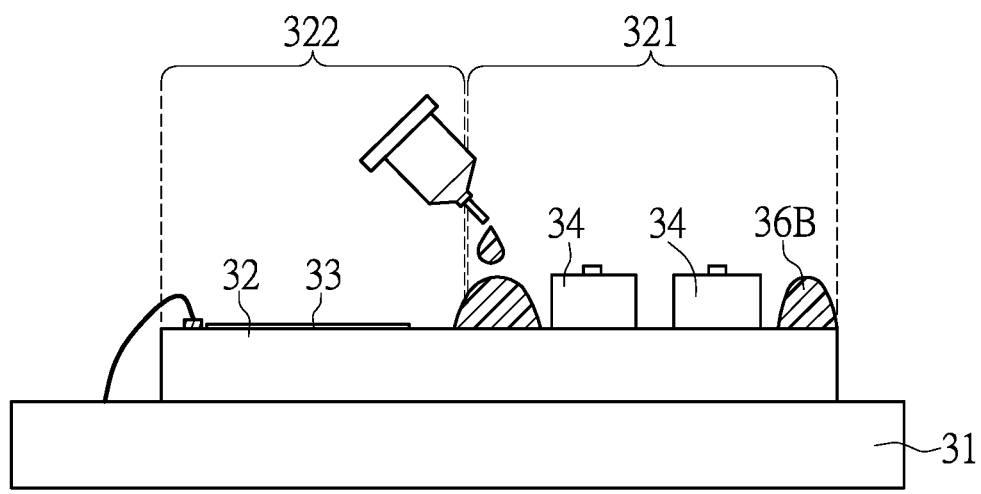
FIG. 3B is a cross-sectional view taken along line IIIB-IIIB of FIG. 3A.

Moreover, as shown in FIG. 2A and FIG. 2B, for example, in order to reduce the light emitted from the at least one light emitting element 34 to be directly transmitted to the light receiver 33, the light blocking material 36A is coated on an area that is adjacent to both the at least one light emitting element 34 and the light receiver 33 through dispensing. On the other hand, as shown in FIG. 3A and FIG. 3B, a light blocking material 36B can be coated around the light emitting area 321 of the chip 32 (i.e., the at least one light emitting element 34), so as to form the light blocking material 36B that is U-shaped. The thickness of the light blocking materials 36A and 36B are less than or equal to that of the at least one light emitting element 34, and the thickness is preferably to be greater than or equal to 0.5 mm, but the present disclosure is not limited thereto. In addition to blocking lights, the thickness of the light blocking materials 36A and 36B can also be taken as a reference thickness of subsequent cutting or etching processes, that is, as a cutting stop layer or an etching stop layer. The light blocking materials 36A and 36B can reduce light emitted by the at least one light emitting element 34 from being directly transmitted to the light receiver 33. The light blocking material 36B is coated to three sides of the light emitting area 321 except for a side where the wires 35 are connected to, such that the light blocking material 36B forms an open type surrounding structure around the light emitting area 321 which can further reduce the light emitted by the at least one light emitting element 34 from being transmitted underneath the at least one light emitting element 34, causing the problem of light leakage to occur. Furthermore, the light blocking materials 36A and 36B are more preferably to be light absorbing or limited-wavelength light permeable liquid crystal polymer, epoxy resin, or silicone resin that is preferably dark or black, and the thixotropic index of the light blocking materials 36A and 36B is preferably greater than or equal to 2.5, so as to maintain a height to width ratio of the light blocking material 36A and 36B under 1:1.3 after dispensing.

Figure 2C:
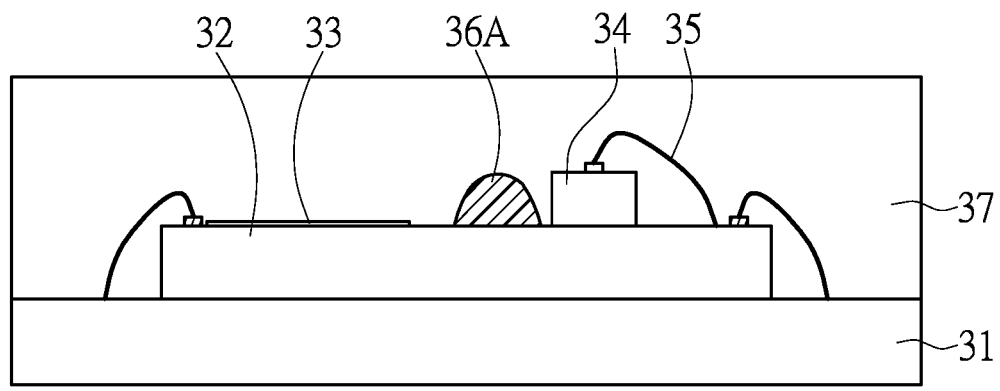
FIG. 2C is a cross-sectional view of a chip disposed with a light permeable material of the present disclosure.
Figure 3C:
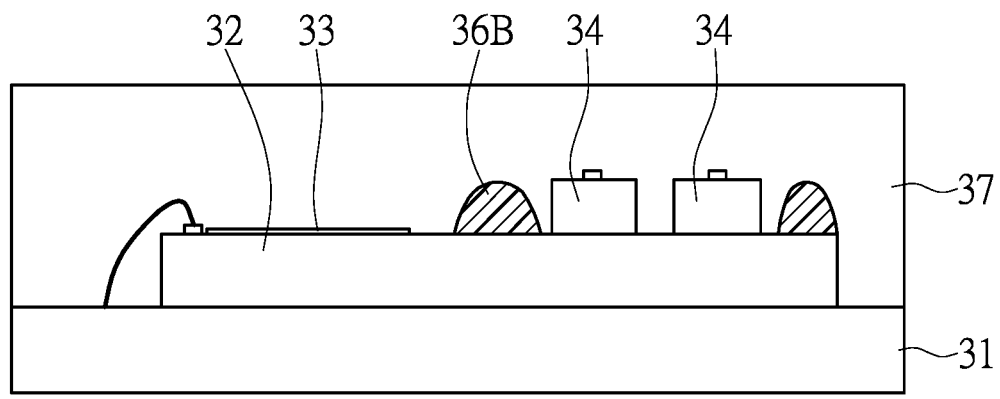
FIG. 3C is a cross-sectional view of the chip disposed with the light permeable material of the present disclosure.

Next, in step S204, a light permeable material 37 is filled to cover the circuit board 31, the chip 32, the light blocking materials 36A and 36B, and the at least one light emitting element 34, and the light permeable material 37 is further covered on the light receiver 33 and the wire 35. The light permeable material 37 is preferably epoxy resin or silicone, and can be covered on the at least one light emitting element 34, the light receiver 33, the chip 32, the circuit board 31, and the wire 35 through molding, so as to protect the abovementioned elements, as shown in FIG. 2C and FIG. 3C.

Next, in step S205, a part of the light permeable material 37 disposed between the light emitting area 321 and the light receiving area 322 is removed, forming a first recess 381 that exposes the light blocking material 36A or the light blocking material 36B. The light emitted by the at least one light emitting element 34 can be transmitted in the light permeable material 37. Therefore, as shown in FIG. 2D and FIG. 3D, the first recess 381 reduces the light emitted by the at least one light emitting element 34 and being directly transmitted to the light receiver 33.

Figure 2D:
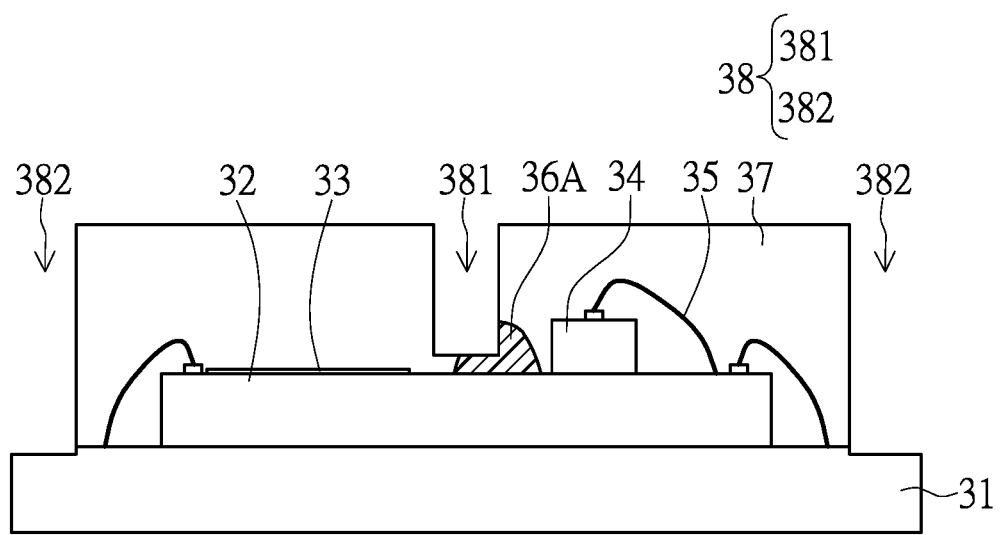
FIG. 2D is a cross-sectional view of the present disclosure having a part of the light permeable material and a part of a circuit board removed.
Figure 3D:
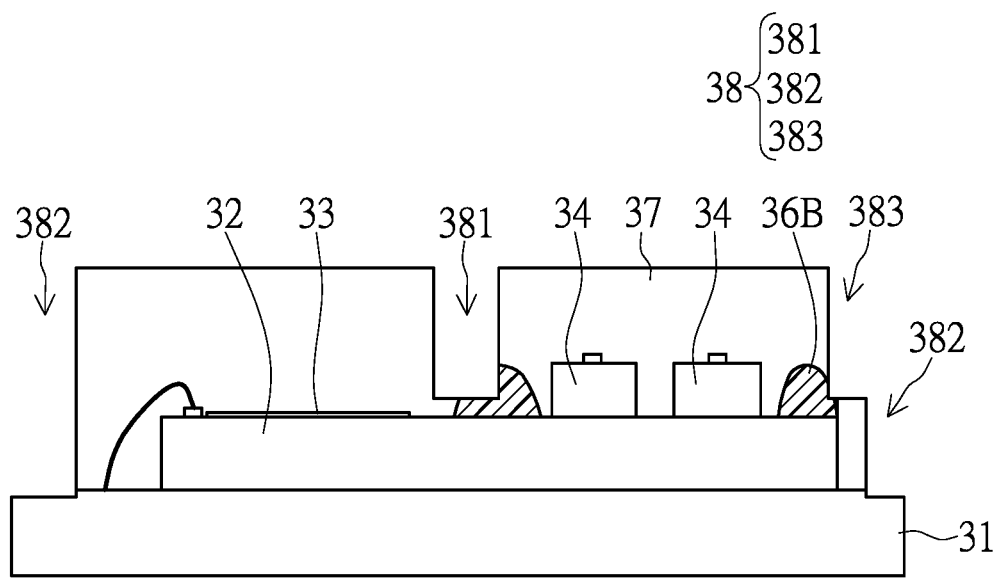
FIG. 3D is a cross-sectional view of the present disclosure having a part of the light permeable material and a part of a circuit board removed.

On the other hand, in other embodiments, in step S205, in addition to forming the first recess 381, the light permeable material 37 disposed on circuit board 31 and around the chip 32 is further removed partially to form a second recess 382, as shown in FIG. 2D and FIG. 3D, such that an anti-light-leakage material 39 is also filled in the second recess 382 in the subsequent processes so as to form a surrounding wall around the chip 32. In addition, the second recess 382 can be formed through cutting the light permeable material 37 downwardly, so as to remove a part of the light permeable material 37 and a part of the circuit board 31. Therefore, the anti-light-leakage material 39 filled in the second recess 382 which extends into the circuit board 31 and surrounding the remaining light permeable material 37 and circuit board 31 is able to effectively block the light emitted by the at least one light emitting element 34 from being directly transmitted to the light receiving area 322 through the light permeable material 37.

Moreover, in other embodiments, as shown in FIG. 3D, a third recess 383 can be further formed on two sides of the light emitting area 321 to expose the light blocking material 36B which is coated around the light emitting area 321 of the chip 32, the third recess 383 is formed above the second recess 382 and communicated to the second recess 382, the depth of the third recess 383 is less than that of the second recess 382, and the width of the third recess 383 is larger than that of the second recess 382. Furthermore, it should be noted that, the embodiments of the present disclosure can have only the first recess 381 formed, or can have the first recess 381 and the second recess 382 sequentially formed, the present disclosure does not limit the forming sequence of the recesses, and the first recess 381 and the second recess 382 can be in any shape, such as a U-shaped recess, and the present disclosure is not limited thereto.

Furthermore, as shown in FIG. 2D and FIG. 3D, in step S205, the light permeable material 37 in a predetermined position can be removed by cutting or etching, such that the first recess 381 is formed between the light emitting area 321 and the light receiving area 322, the second recess 382 is formed surrounding the chip 32, and even the third recess 383 is formed on the two sides of the light emitting area 321, which is convenient for a first anti-light-leakage material 391 and a second anti-light-leakage material 392 to be respectively filled in the first recess 381, the second recess 382, and the third recess 383 (the recesses 38) in the subsequent processes. In addition, in the step of removing a part of the light permeable material 37, when forming the first recess 381 and the third recess 383, the thickness of the light blocking material 36A or 36B can be taken as a reference, such that the light blocking material 36A or 36B can be a cutting stop layer or an etching stop layer. When cutting or etching the light permeable material 37 downwardly toward a direction of the chip 32, a cutting tool is utilized to cut downwardly along the vertical axis to form the first recess 381 or the third recess 383. That is to say, when cutting or etching toward the direction of the chip 32, a preferable cutting or etching stop point is at least 0.04 mm above the chip 32, which is where the light blocking material 36A or the light blocking material 36B is exposed in the first recess 381 or the third recess 383, indicating that the cutting or etching depth is sufficient, at this time, the chip 32 can be damaged if the cutting or the etching continues. The width of the first recess 381 is substantially 0.2 mm, depending on the manufacturing process and the selection of the light absorbing material. The predetermined position of cutting or etching does not have to be exactly above the light blocking material 36A or the light blocking material 36B, as long as the predetermined position of cutting or etching is partially above the light blocking material 36A or the light blocking material 36B. According to the above, in addition to reducing light leakage, the light blocking material 36A or and 36B of the present disclosure can be a reference position for the subsequent cutting or etching processes.

To be more specific, reference is made to FIG. 3A and FIG. 3D, in the step of removing the part of the light permeable material 37 surrounding the chip 32, at least one cut can be formed additionally through cutting (or etching) downwardly relative to the horizontal axis, so as to form the third recess 383 which is at least 0.04 mm above the chip 32. That is to say, the third recess 383 partially overlaps with the second recess 382 surrounding the chip 32, which forms a recess structure in the shape of a step. Furthermore, as shown in FIG. 3D, for example, the light blocking material 36B extending laterally on the two sides of the light emitting area 321 can be the cutting or etching stop layer, and a part of the light blocking material 36B is exposed relative to the afore-mentioned recess structure in the shape of a step.

In step S206, the anti-light-leakage material 39 is filled in the first recess 381. In addition, lastly, as shown in FIG. 2E and FIG. 2F, or FIG. 3E and FIG. 3F, in step S206, the first anti-light-leakage material 391 can be filled in the first recess 381 formed through removing a part of the light permeable material 37, or the first anti-light-leakage material 391 and the second anti-light-leakage material 392 can be filled in the first recess 381, the second recess 382, and the third recess 383 formed through removing another part of the light permeable material 37, so as to complete the manufacturing process of the present disclosure. The problem of light being directly transmitted laterally can be effectively reduced through stacking two different materials. That is to say, the light blocking effect can be achieved through having the light blocking material 36A or 36B and the first anti-light-leakage material 391 stacking upon each other to form a blocking barrier between the light emitting area 321 and the light receiving area 322. The second anti-light-leakage material 392 can be filled in the second recess 382, as shown in FIG. 2D, or the second recess 382 and the third recess 383, as shown in FIG. 3D, such that an anti-light-leakage structure is formed on the circuit board 31 and surrounding the chip 32, especially when a part of the anti-light-leakage structure is fixed within the circuit board 31, and the surrounding ambient light can be effectively blocked. In another embodiment, as shown in FIG. 3E, the second anti-light-leakage material 392 is also filled in the third recess 383 so as form an inverted L wall on two sides of chip and stacked on the light blocking material 36B, such that the light being transmitted underneath the light emitting element 34 is further reduced.

Furthermore, through the manufacturing method of the optical sensor package of the present disclosure, the surface area of the optical sensor can be effectively decreased for approximately 2.3% to 9.3%, and the volume of the optical sensor is substantially 4.2 mm×2.6 mm×1 mm. The light blocking material 36A and 36B are light absorbing materials or composed of limited-wavelength light permeable liquid crystal polymer, epoxy resin, or silicone resin. The thixotropic index of the light blocking materials 36A and 36B is preferably greater than or equal to 2.5. The anti-light-leakage material 39 is composed of a light blocking material that is light absorbing or limited-wavelength light permeable, the viscosity of the anti-light-leakage material 39 is less than 1 k centipoise (cP).

Embodiment of the Package

Figure 2E:
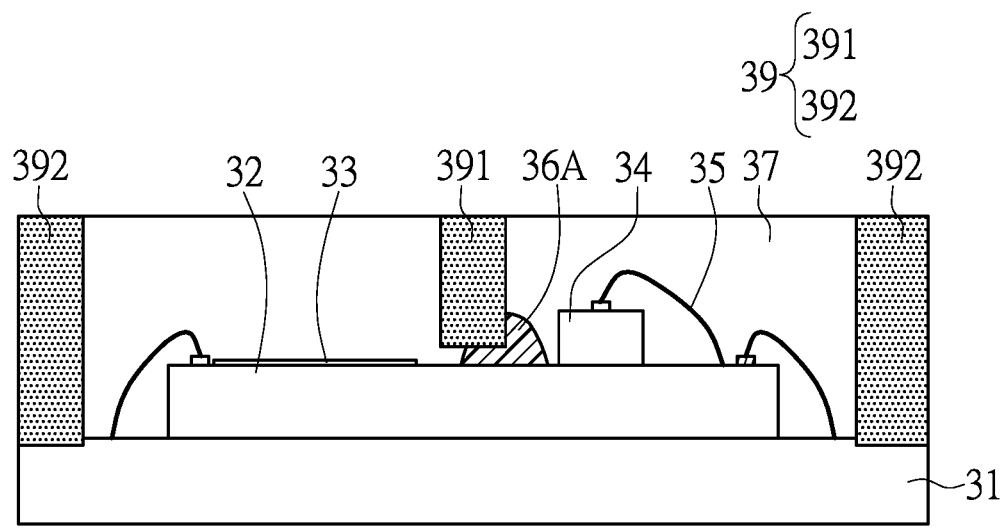
FIG. 2E and FIG. 2F are respectively a cross-sectional view and a top view of the present disclosure coated with an anti-light-leakage material.
Figure 2F:
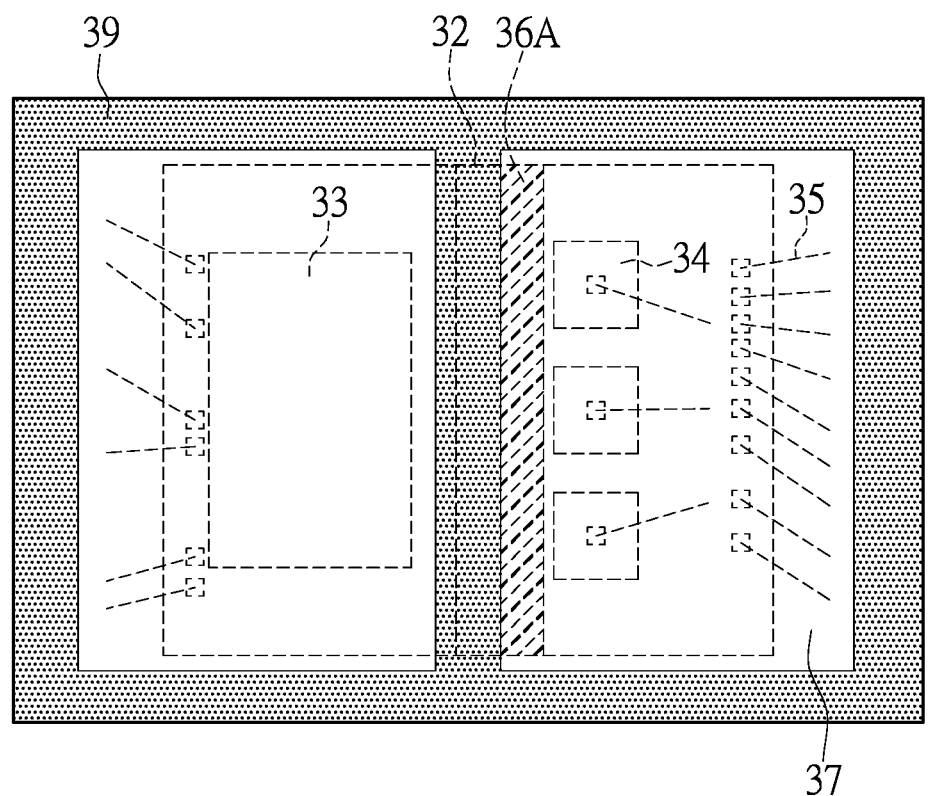
Figure 3E:
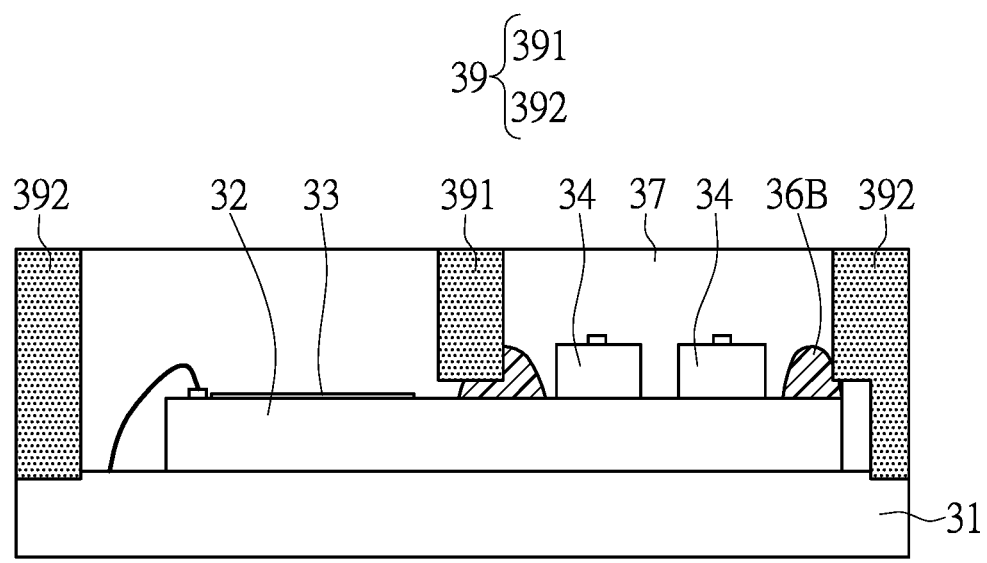
FIG. 3E and FIG. 3F are respectively a cross-sectional view and a top view of the present disclosure coated with the anti-light-leakage material.
Figure 3F:
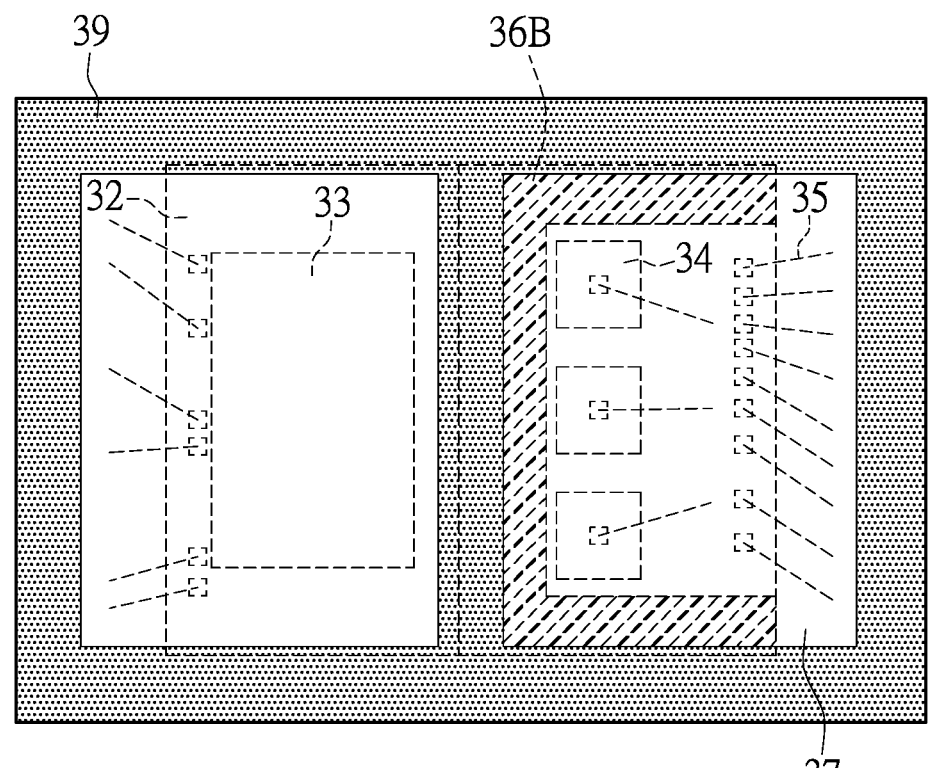

References are made to FIG. 2E and FIG. 2F, as well as FIG. 3E and FIG. 3F. In a preferable embodiment of the present disclosure, the optical sensor package of the present disclosure includes a circuit board 31, a chip 32, a light receiver 33, a light emitting element 34, a plurality of wires 35, a light blocking material 36A or 36B, a light permeable material 37, and an anti-light-leakage material 39.

The chip 32 is disposed on the circuit board 31, the chip 32 includes a light emitting area 321 and a light receiving area 322, the light receiver 33 is disposed on the light receiving area 322 of the chip 32, and the light emitting element 34 is disposed on the light emitting area 321 of the chip 32, and the chip 32 and the light emitting element 34 are electrically connected to the circuit board 31 through the plurality of wires 35. The light blocking material 36A or 36B is disposed between the light emitting area 321 and the light receiving area 322. The light blocking material 36A is coated on an area adjacent to the light emitting area 321 and the light receiving area 322 through dispensing, thereby forming a lower blocking barrier between the light emitting element 34 and the light receiver 33, as shown in FIG. 2C. On the other hand, in another embodiment, the light blocking material 36B can be coated around the light emitting element 34, which forms a lower blocking barrier in a U-shaped or dam-shaped structure, which is labeled 36B in FIG. 3A and FIG. 3B, so as to reduce the light emitted by the light emitting element 34 being directly transmitted laterally to the light receiver 33. The thickness of the light blocking material 36A and 36B is less than or equal to the height of the light emitting element 34, more preferably greater than or equal to 0.5 mm, but the present disclosure is not limited thereto. In addition to blocking light, the thickness of the light blocking material 36A and 36B can also be taken as a reference thickness, i.e., the cutting or etching stop layer, of the subsequent cutting or etching processes.

The light permeable material 37 covers and protects the circuit board 31, the chip 32, the light receiver 33, the light emitting element 34, the plurality of wires 35, and the light blocking material 36A or 36B. The anti-light-leakage material 39 is disposed in the recesses 38 formed by cutting the light permeable material 37. Furthermore, after forming the light permeable material 37, the light permeable material 37 is cut or etched, the first recess 381 is formed between the light emitting element 34 and the light receiver 33, and the second recess 382, as shown in FIG. 2D, or the second recess 382 and the third recess 383, as shown in FIG. 3D, are further formed around the chip 32, such that the first anti-light-leakage material 391 and the second anti-light-leakage material 392 can be respectively filled in the first recess 381 and the second recess 382 formed by cutting the light permeable material 37, as shown in FIG. 2D, or the first recess 381, the second recess 382, and the third recess 383 formed by cutting the light permeable material 37, as shown in FIG. 3D. In addition, the second recess 382 can be formed through cutting a part of the light permeable material 37 and a part of the circuit board 31.

In addition, after filling the anti-light-leakage material 39, the first anti-light-leakage material 391 is stacked on a lower blocking barrier formed by the light blocking material 36A or 36B, which further forms an upper blocking barrier stacking on top of the lower blocking barrier. To be more specific, a blocking barrier in the shape of a step is formed by the first anti-light-leakage material 391 being stacked on and connected to the light blocking material 36A or 36B, which is a stacked lateral light blocking structure that has an enhanced effect of light blocking. In other embodiments, the removed area of the light permeable material 37 can include the area around the chip 32 and partially above the chip 32, which is the position of the third recess 383 as shown in FIG. 3D. Furthermore, the abovementioned position of the third recess 383 partially overlaps with the position that is defined by the light blocking material 36B which extends on the two sides of the light emitting area 321 in a U-shaped structure or a dam-shaped structure. In other words, the light blocking material 36B is partially exposed from each of the third recess 383 on the two sides of the light emitting area 321. Therefore, when the second anti-light-leakage material 392 is formed surrounding the chip 32, a part of the second anti-light-leakage material 392 is filled in the third recess 383, i.e., stacked on a part of the light blocking material 36B surrounding the light emitting element 34, the other part of the second anti-light-leakage material 392 is filled in the second recess 382, i.e., stacked on the circuit board 31, thus eventually forming a surrounding step wall as shown in FIG. 3E and FIG. 3F.

The recesses 38 can be formed through, firstly forming the light permeable material 37, and then forming the recesses 38 on the light permeable material 37 through cutting or etching processes. In other embodiments, molds can be put on the optical sensor package, and then the light permeable material 37 can be filled and cured in the molds. As the light permeable material 37 is cured and shaped, the recesses 38 are formed simultaneously.

One of the advantages of the present disclosure is that, in the optical sensor package and the manufacturing process for the same, the light blocking material can be disposed under the light permeable material, so as to reduce the problem of light leakage, and prevent the chip from being damaged in the cutting or etching process, thereby decreasing the total volume of the optical sensor.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A manufacturing method of an optical sensor package, comprising:
    disposing a chip on a circuit board, the chip having a light emitting area and a light receiving area;
    disposing at least one light emitting element on the light emitting area of the chip, the at least one light emitting element being electrically connected to the circuit board;
    coating a light blocking material between the light emitting area and the light receiving area;
    filling a light permeable material that covers the circuit board, the chip, the light blocking material, and the at least one light emitting element;
    removing a part of the light permeable material disposed between the light emitting area and the light receiving area, so as to form a first recess and expose a part of the light blocking material; and
    filling an anti-light-leakage material in the first recess to form a lateral light blocking structure through stacking the anti-light-leakage material and the light blocking material, so as to block light emitted by the at least one light emitting element from being laterally transmitted to the light receiving area.

2. The manufacturing method according to claim 1, wherein in the step of coating the light blocking material, the light blocking material is dispensed to form a blocking barrier between the light emitting area and the light receiving area.

3. The manufacturing method according to claim 2, wherein the light blocking material is further coated on two sides of the light emitting area so as to form a U-shaped structure or a dam-shaped structure.

4. The manufacturing method according to claim 1, wherein when removing the part of the light permeable material, a part of the light permeable material surrounding the chip is further removed, so as to form a second recess, and when filling the anti-light-leakage material, the anti-light-leakage material is further filled in the second recess, so as to block ambient light from being transmitted to the light transmitting area and the light receiving area.

5. The manufacturing method according to claim 4, wherein the second recess extends into the circuit board, and when filling the anti-light-leakage material, the anti-light-leakage material is further formed within the circuit board.

6. The manufacturing method according to claim 4, wherein the light blocking material is further coated on two sides of the light emitting area so as to form a U-shaped structure or a dam-shaped structure.

7. The manufacturing method according to claim 6, wherein in the step of removing the part of the light permeable material, when further forming a third recess on two sides of the chip so as to expose a part of the U-shaped structure or the dam-shaped structure, and the second recess and the third recess are communicated to each other.

8. The manufacturing method according to claim 1, wherein a thixotropic index of the light blocking material is greater than or equal to 2.5.

9. The manufacturing method according to claim 1, wherein a viscosity of the anti-light-leakage material is less than 1 k centipoise (cP).

10. An optical sensor package, comprising:
    a circuit board;
    a chip disposed on the circuit board and electrically connected to the circuit board, the chip having a light emitting area and a light receiving area;
    at least one light emitting element disposed on the light emitting area of the chip;
    a light blocking material disposed between the light emitting area and the light receiving area;
    a light permeable material covered on the circuit board, the chip, the at least one light emitting element, and the light blocking material, and the light permeable material having a first recess that exposes a part of the light blocking material; and
    an anti-light-leakage material disposed in the first recess formed by the light permeable material;
    wherein the light blocking material and the anti-light-leakage material are stacked to form a lateral light blocking structure, and light emitted by the at least one light emitting element is blocked from being laterally transmitted to the light receiving area by the lateral light blocking structure.

11. The optical sensor package according to claim 10, wherein a thickness of the light blocking material is equal to or less than a height of the light emitting element.

12. The optical sensor package according to claim 10, wherein the light blocking material is further coated on two sides of the light emitting area so as to form a U-shaped structure or a dam-shaped structure.

13. The optical sensor package according to claim 10, wherein the light permeable material further includes a second recess surrounding the chip, and the anti-light-leakage material is disposed in the second recess to block ambient light from being transmitted to the light emitting area and the light receiving area.

14. The optical sensor package according to claim 13, wherein the light permeable material further includes a third recess on two sides of the chip, and the anti-light-leakage material disposed in the third recess is connected to the anti-light-leakage material disposed in the second recess.

15. The optical sensor package according to claim 14, wherein the light blocking material is further coated on two sides of the light emitting area so as to form a U-shaped structure or a dam-shaped structure exposed form the third recess connected to the anti-light-leakage material.

16. The optical sensor package according to claim 10, wherein the light permeable material further includes a second recess, the second recess extends into the circuit board, and when filling the anti-light-leakage material, the anti-light-leakage material is further formed within the circuit board.

17. The optical sensor package according to claim 10, wherein a thixotropic index of the light blocking material is greater than or equal to 2.5.

18. The optical sensor package according to claim 10, wherein a height to width ratio of the light blocking material is under 1:1.3.

19. The optical sensor package according to claim 10, wherein a viscosity of the anti-light-leakage material is less than 1 k centipoise (cP).

20. An optical sensor package, comprising:

a circuit board;

a chip disposed on the circuit board and electrically connected to the circuit board, the chip having a light emitting area and a light receiving area;

at least one light emitting element disposed on the light emitting area of the chip;

a light blocking material disposed between the light emitting area and the light receiving area;

wherein the light blocking material and an anti-light-leakage material are stacked to form a lateral light blocking structure, and light emitted by the at least one light emitting element is blocked from being laterally transmitted to the light receiving area by the lateral light blocking structure;

wherein a recess extends into the circuit board, the anti-light-leakage material is further formed within the circuit board.

* * * * *